(12) United States Patent
Cheng

(10) Patent No.: US 9,534,747 B2
(45) Date of Patent: Jan. 3, 2017

(54) LIGHT-EMITTING DIODE ASSEMBLY AND FABRICATION METHOD THEREOF

(71) Applicants: HUGA OPTOTECH INC., Taichung (TW); Interlight Optotech Corporation, Yangmei, Taoyuan County (TW)

(72) Inventor: Tzu-Chi Cheng, Yangmei (TW)

(73) Assignees: Huga Optotech Inc., Taichung (TW); Interlight Optotech Corporation, Yangmei, Taoyuan County (TW)

( * ) Notice: Subject to any disclaimer, the term of this patent is extended or adjusted under 35 U.S.C. 154(b) by 0 days.

(21) Appl. No.: 14/506,364

(22) Filed: Oct. 3, 2014

(65) Prior Publication Data

US 2015/0099320 A1    Apr. 9, 2015

(30) Foreign Application Priority Data

Oct. 7, 2013   (TW) .............................. 102136175 A

(51) Int. Cl.
| | |
|---|---|
| *F21K 9/90* | (2016.01) |
| *F21K 99/00* | (2016.01) |
| *H01L 25/075* | (2006.01) |
| *H01L 23/00* | (2006.01) |

(52) U.S. Cl.
CPC ................ *F21K 9/90* (2013.01); *H01L 24/97* (2013.01); *H01L 24/29* (2013.01); *H01L 24/32* (2013.01); *H01L 24/48* (2013.01); *H01L 24/83* (2013.01); *H01L 25/0753* (2013.01); *H01L 2224/293* (2013.01); *H01L 2224/2929* (2013.01); *H01L 2224/32245* (2013.01); *H01L 2224/48229* (2013.01); *H01L 2224/48249* (2013.01); *H01L 2224/73265* (2013.01); *H01L 2224/83005* (2013.01); *H01L 2224/83192* (2013.01); *H01L 2224/83851* (2013.01); *H01L 2224/83862* (2013.01); *H01L 2224/9202* (2013.01); *H01L 2224/97* (2013.01); *H01L 2924/12041* (2013.01); *H01L 2933/0033* (2013.01)

(58) Field of Classification Search
CPC .................... H01L 25/0753; H01L 2933/0033; H01L 24/00; F21K 9/90
See application file for complete search history.

(56) References Cited

U.S. PATENT DOCUMENTS

| | | | | |
|---|---|---|---|---|
| 7,811,843 | B1* | 10/2010 | Lai ...................... | H01L 25/0753 257/E21.502 |
| 8,227,271 | B1* | 7/2012 | Ho ......................... | H01L 24/97 257/E33.059 |
| 2009/0065789 | A1* | 3/2009 | Wang ................ | G02F 1/133603 257/88 |
| 2010/0190280 | A1* | 7/2010 | Horiuchi ............. | H01L 21/6836 438/28 |
| 2012/0153328 | A1* | 6/2012 | Tsutsui ................. | H01L 33/505 257/98 |

\* cited by examiner

*Primary Examiner* — Anthony Ho
*Assistant Examiner* — Victor Barzykin
(74) *Attorney, Agent, or Firm* — Muncy, Geissler, Olds & Lowe, P.C.

(57) ABSTRACT

Disclosed embodiments include a manufacturing method for an LED assembly. Providing a first carrier, wherein several LED chips are formed on the first carrier, and providing a second carrier. Attaching the second carrier to the LED chips and detaching the first carrier from the LED chips but leaving the LED chips on the second carrier.

10 Claims, 5 Drawing Sheets

LIGHT-EMITTING DIODE ASSEMBLY AND FABRICATION METHOD THEREOF

CROSS-REFERENCE TO RELATED APPLICATION

This application claims priority to and claims the benefit of Taiwan Patent Application Serial Number 102136175 filed on Oct. 7, 2013, which is incorporated by reference in its entirety.

FIELD OF THE INVENTION

Embodiments of the application relate to a method for fabricating LED (light emitting diode) assemblies.

BACKGROUND

Applications of various LED goods, such as traffic signs, motorcycle tail lights, automobile head lights, street lamps, computer indicators, flashlights, LED backlight sources, etc., can now be seen in daily life. In addition to the chip process, almost all of these products are gone through packaging procedure as well.

FIG. 1 shows a conventional process of LED assemblies. First, a sapphire substrate 10 is provided. Subsequently, semiconductor fabrication processes like epitaxial process, thin film deposition, lithography and etching are performed to form multiple LED chips on the sapphire substrate 10, as the wafer 12 shows. Each LED chip may have one or more LED units, and each LED unit comprises a light-emitting layer. In the light-emitting layer, light is emitted due to recombination of electrons and holes. Each wafer 12 is examined by the wafer acceptance test (WAT) first, and then the qualified wafer 12 is cut to form individual LED chips. The LED chip is also referred as LED die. Each LED chip is inspected and classified according to the photoelectric characteristics thereof, such as forward voltage, dominant wavelength, luminous intensity, etc. LED chips have same photoelectric characteristic are picked and placed on a temporary carrier film, and the temporary carrier film may be a blue tape or a tape-on-reel having a surface for the chips to be mounted thereon. In FIG. 1, three different kinds of LED chips are placed on the temporary carrier films B1, B2 and B3, respectively. LED packaging manufacturers purchase temporary carrier films with LED chips and produce LED assemblies after appropriate packaging process. For example, the LED assembly 14 in FIG. 1 comprises an LED chip 16, a cooling base 18, bonding wires 20, silicone 22 and a lens 24.

Nevertheless, the process of removing LED chips one by one from a temporary carrier film and to fix them to the base of a LED product is usually very time consuming.

DETAILED DESCRIPTION OF THE EMBODIMENTS

Figure 1:
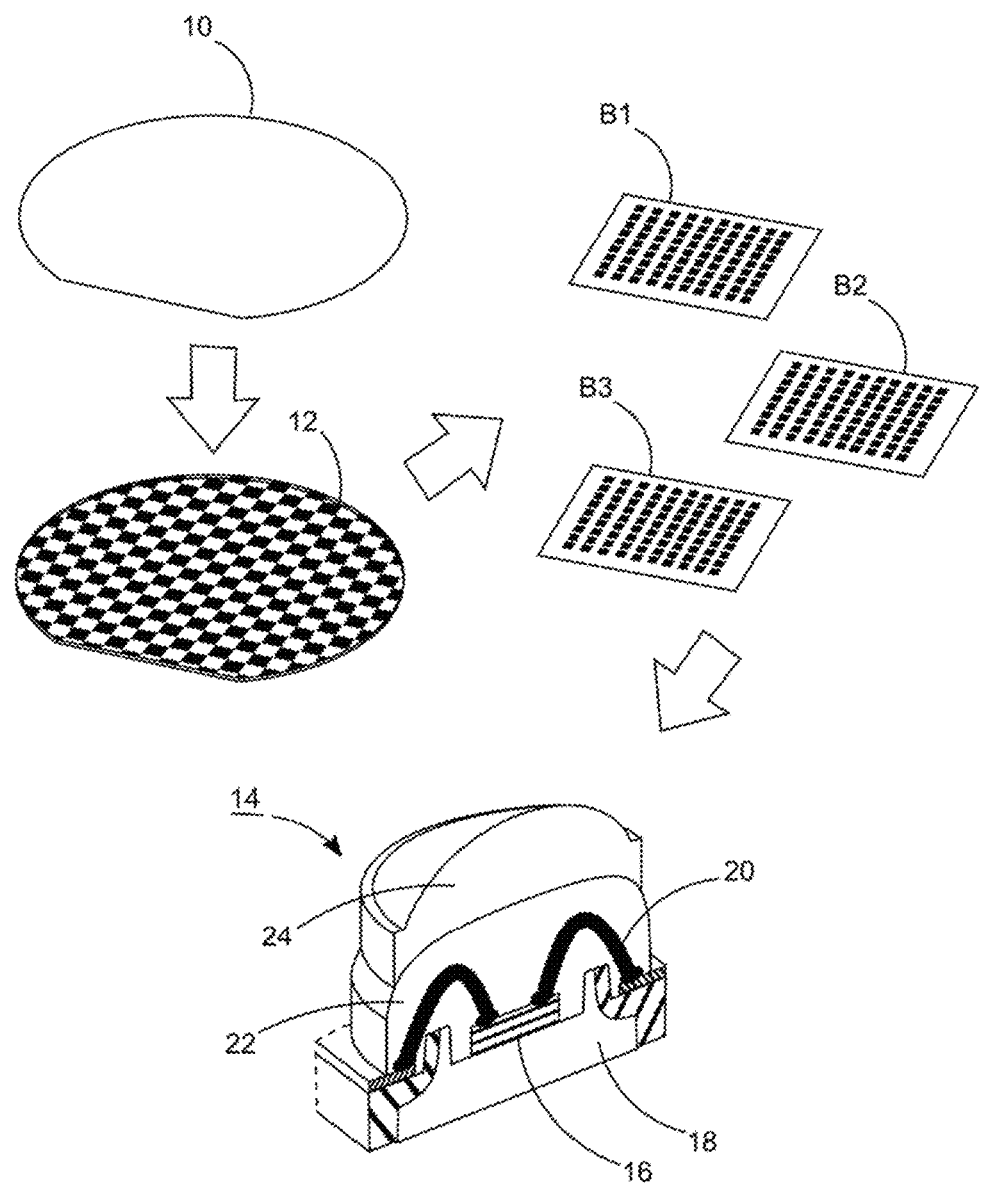
FIG. 1 shows a fabrication process of an LED assembly.
Figure 2:
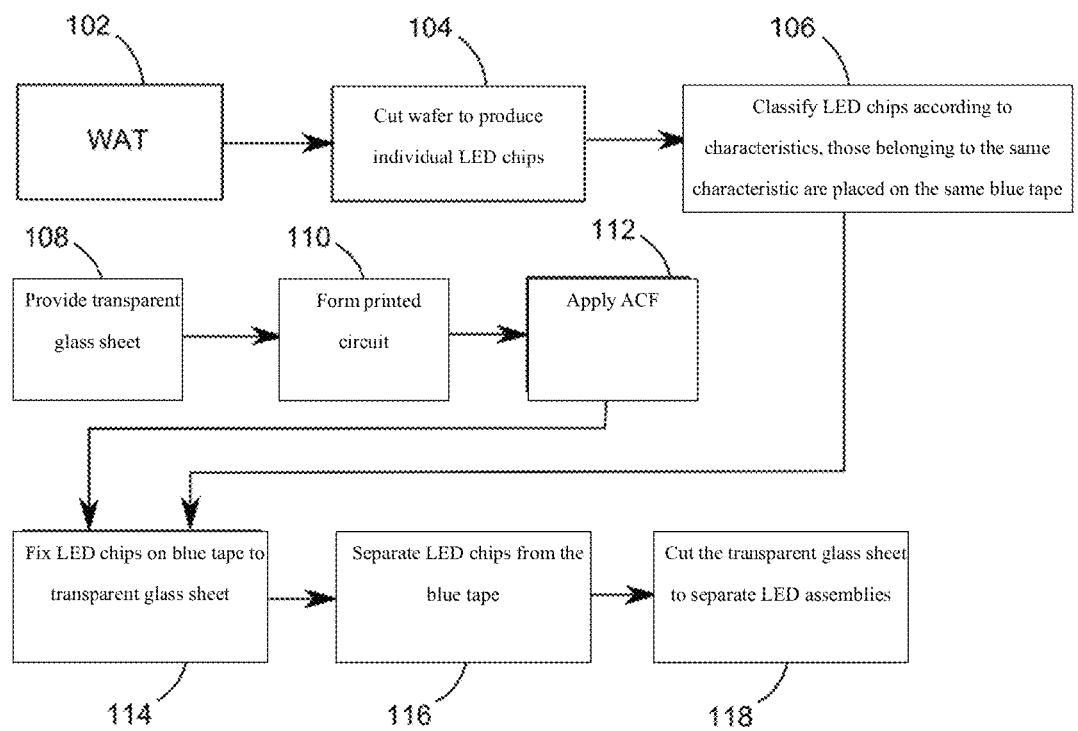
FIG. 2 shows a fabrication method of an LED assembly according to an embodiment of the present application.
Figure 3:
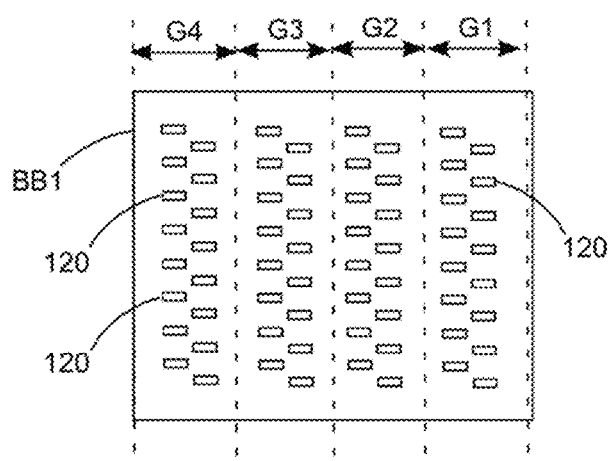
FIG. 3 shows a temporary carrier film according to an embodiment of the present application.

FIG. 2 shows a fabrication method of LED assemblies according to the present application. In step 102, a wafer acceptance test (WAT) is performed on the wafer 12 that comprises chips to determine if the wafer meets the specifications. In step 104, a cutting process is applied on the qualified wafer 12 to form individual LED chips. Each LED chip is inspected to be classified according to the photoelectric characteristics thereof, such as forward voltage, dominant wavelength, luminous intensity, etc. and the LED chips have same photoelectric characteristic are placed on a temporary carrier film in step 106. The temporary carrier film may be a blue tape. FIG. 3 shows a temporary carrier film BB1 according to the present application, which LED chips 120 of the same photoelectric characteristic are mounted thereon. The LED chips 120 on the temporary carrier film BB1 can be roughly divided into 4 groups of G1, G2, G3 and G4 based on the locations. The locations of all LED chips 120 within each group form a pattern, and the patterns are substantially the same for all groups as shown in FIG. 3.

Figure 4:
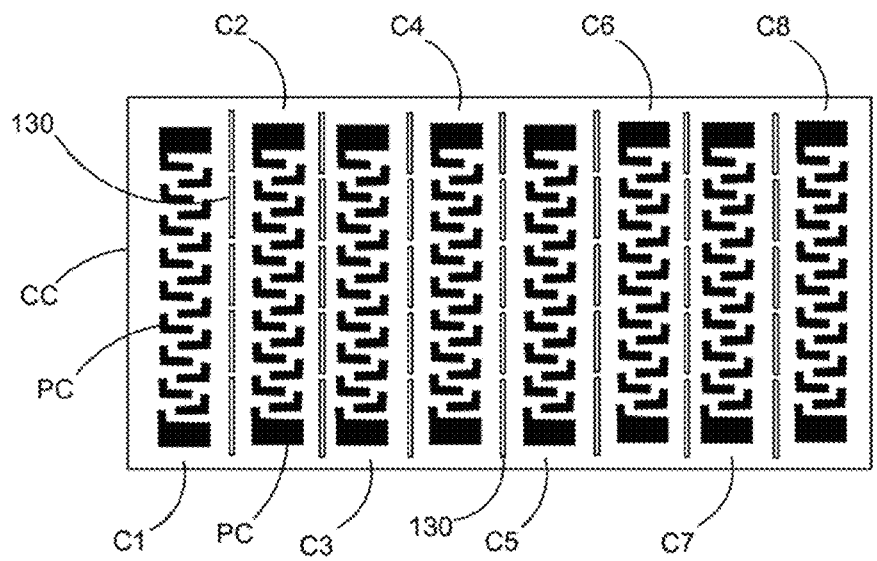
FIG. 4 shows a transparent carrier according to another embodiment of the present application.

In FIG. 2, a transparent carrier is provided in step 108 as an example of carriers, wherein the transparent carrier comprises a material that is transparent to the light emitted by the LED chips, such as sapphire, glass or transparent silicon carbide sheets. In step 110, a printed circuit is formed on the transparent carrier. FIG. 4 shows a transparent carrier CC in an embodiment of the present application, with printed circuits PC formed thereon. The transparent carrier CC comprises a number of grooves 130 thereon to facilitate the subsequent cutting process. The grooves 130 substantially define eight regions C1~C8, and each region has a printed circuit PC of same pattern as shown in FIG. 4.

In the step 112 shown in FIG. 2, an anisotropic conductive film (ACF) is formed on the printed circuits PC.

Figure 5A:
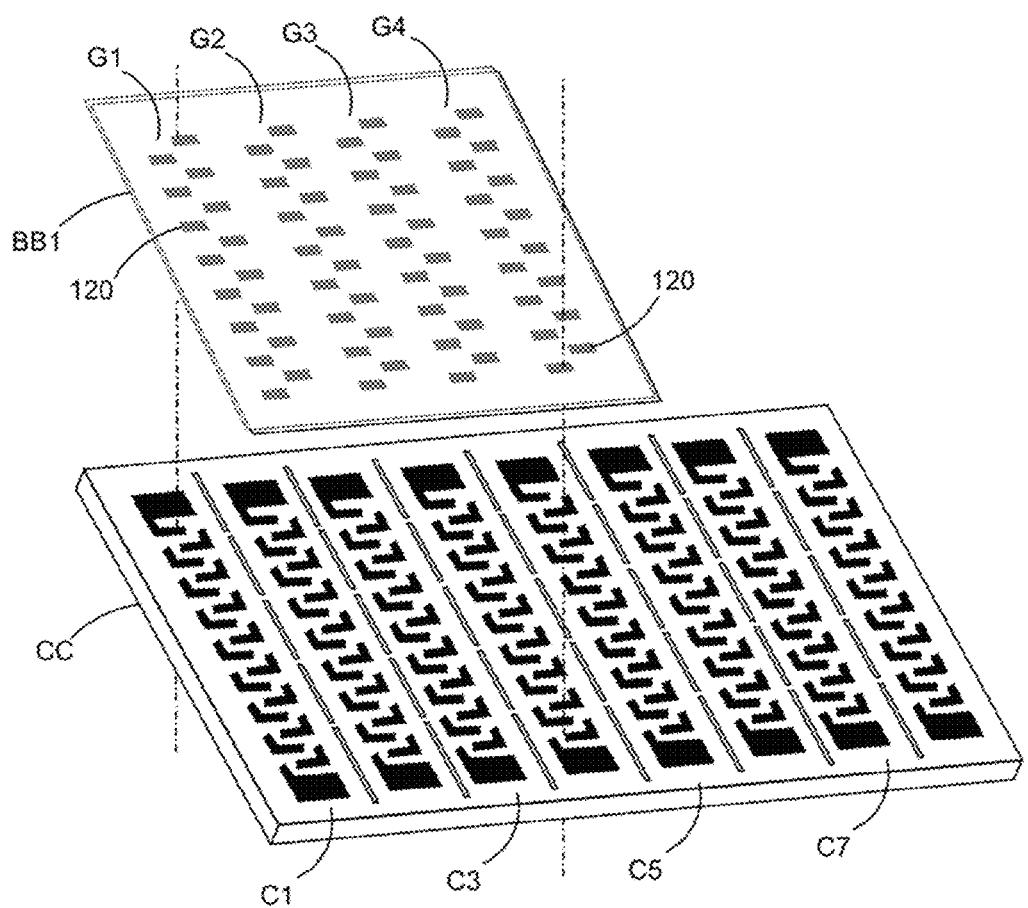
FIG. 5A and FIG. 5B show a transparent carrier and a temporary carrier film before bonding according to an embodiment of the present application.
Figure 5B:
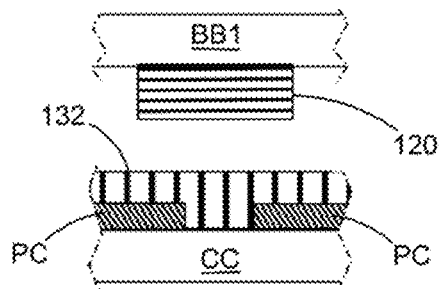

FIG. 5A shows a transparent carrier CC and a temporary carrier film BB1 prior to a bonding process. As shown in FIG. 5A, the LED chip 120 in the group G1 is attached to the region C1 of the transparent carrier CC while the LED chip 120 in the group G2 is attached to the region C2 of the transparent carrier CC; and so on. FIG. 5B shows that the LED chip 120 is bonded to the temporary carrier film BB1, and the transparent carrier CC has printed circuits PC and an ACF 132 thereon. In FIG. 5B, the LED chip 120 is not connected to the transparent carrier CC.

Figure 6:
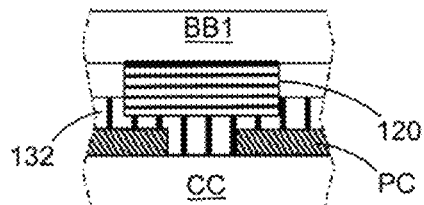
FIG. 6 shows a transparent carrier and a temporary carrier film after bonding according to an embodiment of the present application.

As the step 11 shows in FIG. 2, the LED chip 120 on the temporary carrier film BB1 are bonded with the transparent carrier CC like FIG. 6 shows. In FIG. 6, the LED chip 120 is bonded to the temporary carrier film BB1, and the LED chip 120 is bonded to the transparent carrier CC via the ACF 132.

Figure 7:
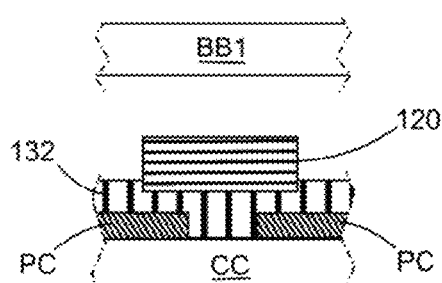
FIG. 7 shows a temporary carrier film is separated from the LED chip according to an embodiment of the present application.

According to the step 116 in FIG. 2, the temporary carrier film BB1 and the LED chip 120 are separated as shown in FIG. 7. For example, the temporary carrier film BB1 may be torn apart directly or after being heated. The heating process may be realized by baking the temporary carrier film BB1, the LED chip 12 and the transparent carrier CC simultaneously or only heating the side of the temporary carrier film BB1 opposing to the LED chip 12. In FIG. 7, the temporary carrier film BB1 and the LED chip 120 are separated while the LED chip 120 remains on the transparent carrier CC and is fixed by the ACF 132.

In FIG. 3, the LED chips 120 of four groups G1~G4 on the temporary carrier film BB1 are respectively fixed to four regions (C1~C4) among eight regions in the transparent carrier CC. In another embodiment, another temporary carrier film that is identical to the temporary carrier film BB1 and has a plurality of LED chips 120 formed thereon may be fixed to the other four regions (C5~C8) in the transparent carrier CC.

Figure 8:
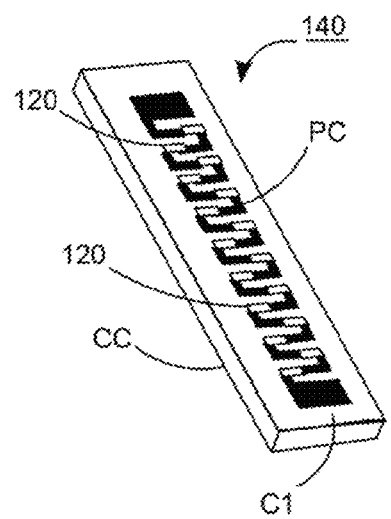
FIG. 8 shows that an LED assembly having a region C1 after the cutting process is completed according to an embodiment of the present application.

According to step 118 in FIG. 2, the transparent carrier CC can be divided along the grooves 130 to separate the eight regions (C1~C8) to be eight LED assemblies. FIG. 8 shows an LED assembly 140 having a region C1 after the cutting process. As shown in FIG. 8, the LED assembly 140 comprises the region C1, which is a part of the transparent carrier CC, and the region C1 comprises the printed circuit PC and the LED chips 120 of the group G1. In FIG. 8, each LED chip 120 is fixed to the transparent carrier CC in a form of flip chip. The electrical connection between every two LED chips 120 is provided by the printed circuit PC and the ACF 132. The printed circuit PC can transmit electrical energy to enable LED chips 120 to emit light.

According to the embodiments in FIGS. 2~8, regardless of the amount of LED chips 120 on the temporary carrier film BB1, all the LED chips 120 can be bonded to the transparent carrier CC in the same time, and all of the LED chips 120 can be separated from the temporary carrier film BB1 in the same time. Compared with a conventional process that moves one LED chip from a carrier film to another carrier a time, the process shown in the embodiments in FIGS. 2~8 greatly simplifies the fabrication steps and improves the throughput.

Figure 9:
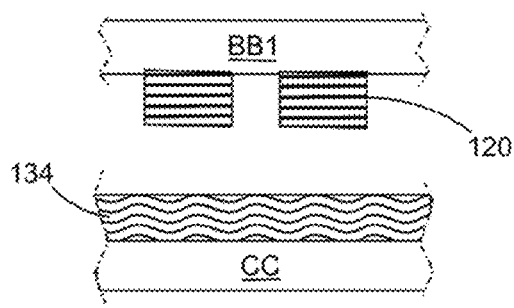
FIG. 9 shows a transparent carrier film and a temporary carrier prior to bonding according to an embodiment of the present application.

Although the LED assembly 140 in FIG. 8 is fixed to the transparent carrier CC in a form of flip chip, the present invention is not limited by the embodiment. FIG. 9 shows that the LED chips 120 are bonded to the temporary carrier film BB1, and a bonding layer 134 is provided on the transparent carrier CC without printed circuit PC. Referring to FIG. 9, the LED chips 120 have not yet been attached to the transparent carrier CC.

Figure 10:
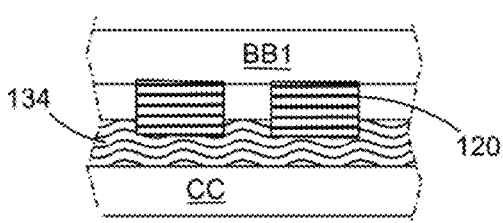
FIG. 10 shows a transparent carrier film and a temporary carrier that have been bonded according to an embodiment of the present application.

FIG. 10 shows a cross-sectional view of an LED assembly in the fabrication process after FIG. 9, wherein the LED chips 120 on the temporary carrier film BB1 are simultaneously bonded to the transparent carrier CC via the bonding layer 134.

Figure 11:
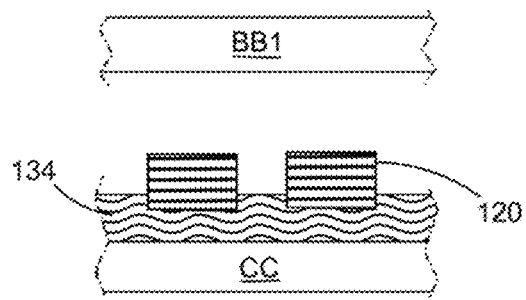
FIG. 11 shows that a temporary carrier film is separated from the LED chip according to an embodiment of the present application.

FIG. 11 shows a cross-sectional view of an LED assembly in the fabrication process after FIG. 10, which shows that the temporary carrier film BB1 is separated from the LED chips 120, while the LED chips 120 are bonded to the transparent carrier CC via the bonding layer 134.

Figure 12:
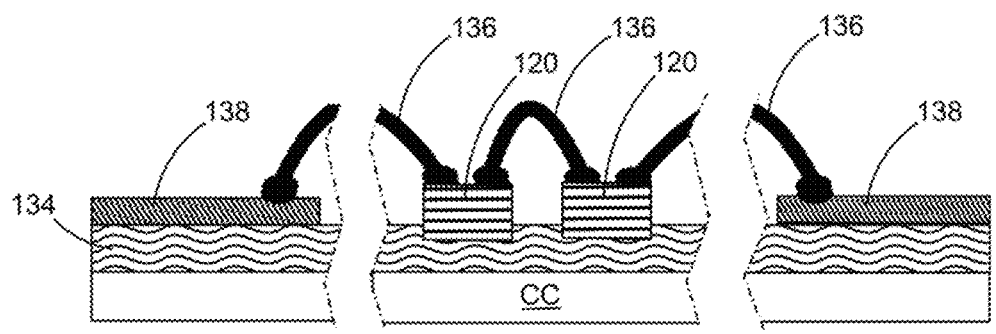
FIG. 12 shows bonding wires are formed on an LED chip according to an embodiment of the present application.

Before the LED chips 120 is bonded to the transparent carrier CC as shown in FIG. 9, or after the LED chips 120 are bonded to the transparent carrier CC as shown in FIG. 10, a conductive electrode plate 138 can be attached to the transparent carrier CC in FIG. 9 or in FIG. 10. As FIG. 11 shows, the temporary carrier film BB1 has been separated from the LED chips 120. As shown in FIG. 12, the bonding wires 136 are formed on the LED chips 120. The bonding wires 136 not only provide electrical connection between the LED chips 120, but also provide electrical connection between the LED chips 120 and the conductive electrode plates 138. As shown in FIG. 12, the electrical connection region of the LED chips 120 (i.e. the region where the conductive electrode plate 138 is located) is different from the region where the LED chips 120 are bonded to the transparent carrier CC; namely, the position, on the transparent carrier CC, of the conductive electrode plate 138 is not overlapped with the position of the LED chip 120, and the LED chips 120 are electrically connected to the conductive electrode plate 138 via the bonding wires 136. Therefore, the LED chips 120 are fixed to the transparent carrier CC not in a form of flip chip. Nevertheless, in order to bond the LED chips 120 to the transparent carrier CC with the front side facing upward, as indicated in FIG. 8, the LED chips 120 are bonded to the transparent carrier CC in a form of flip chip.

The embodiments in FIGS. 2~8 are similar with the embodiments in FIGS. 9~12, that is, regardless of the amount of LED chips 120 on the temporary carrier film BB1, all of the LED chips 120 can be bonded to the transparent carrier CC in the same time, and all of the LED chips 120 can be separated from the temporary carrier film BB1 in the same time. As a result, the fabrication steps can be greatly simplified and the throughput can be improved.

While the disclosure has been described by way of example and in terms of preferred embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. A method for fabricating an LED assembly, comprising:
    providing a first carrier on which a plurality of LED chips is arranged in a pattern;
    providing a second carrier comprising a plurality of grooves;
    forming a conductive film on the second carrier; and
    attaching the plurality of LED chips to the second carrier through the conductive film,
    wherein the plurality of grooves is formed on the second carrier before attaching the plurality of LED chips to the second carrier.

2. The fabrication method of claim 1, wherein the second carrier is a transparent carrier comprising transparent glass or transparent silicon carbide.

3. The fabrication method of claim 1, wherein the second carrier comprises a first region and a second region defined by the plurality of grooves.

4. The fabrication method of claim 3, further comprising a first circuit formed within the first region.

5. The fabrication method of claim 4, further comprising a second circuit which is formed within the second region, wherein the first circuit and the second circuit substantially have a same pattern.

6. A method for fabricating an LED assembly, comprising:
- providing a first carrier on which a first LED chip and a second LED chip are arranged in a first pattern;
- providing a second carrier on which a third LED chip and a fourth LED chip are arranged in a second pattern;
- providing a third carrier comprising a plurality of grooves; and
- attaching the first LED chip, the second LED chip, the third LED chip, and the fourth LED chip to the third carrier,
- wherein the plurality of grooves is formed on the third carrier before the attaching step.

7. The fabrication method of claim 6, further comprising forming a conductive film on the third carrier.

8. The fabrication method of claim 6, further comprising dividing the third carrier along the grooves to form an LED assembly having the first LED chip and the second LED chip arranged in the first pattern.

9. The fabrication method of claim 6, further comprising providing a conductive electrode plate connected to the third carrier.

10. The fabrication method of claim 9, further comprising providing a bonding wire connecting the electrode plate and the first LED chip.

* * * * *